US006414391B1

(12) United States Patent
Corisis et al.

(10) Patent No.: US 6,414,391 B1
(45) Date of Patent: Jul. 2, 2002

(54) MODULE ASSEMBLY FOR STACKED BGA PACKAGES WITH A COMMON BUS BAR IN THE ASSEMBLY

(75) Inventors: David J. Corisis; Walter L. Moden, both of Meridian; Leonard E. Mess; Larry D. Kinsman, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/343,746

(22) Filed: Jun. 30, 1999

Related U.S. Application Data
(60) Provisional application No. 60/091,285, filed on Jun. 30, 1998.

(51) Int. Cl.[7] .............................................. H01L 23/50
(52) U.S. Cl. ..................... 257/738; 257/778; 257/787; 257/698; 257/782; 257/784
(58) Field of Search ................................ 257/738, 778, 257/787, 698, 782–784

(56) References Cited

U.S. PATENT DOCUMENTS

| 3,460,010 A | 8/1969 | Domenico et al. |
| 3,538,397 A | 11/1970 | Davis |
| 3,769,105 A | 10/1973 | Chen et al. |
| 3,772,097 A | 11/1973 | Davis |
| 4,164,751 A | 8/1979 | Tasch, Jr. |
| 4,266,282 A | 5/1981 | Henle et al. |
| 4,317,686 A | 3/1982 | Anand et al. |
| 4,349,862 A | 9/1982 | Bajorek et al. |
| 4,423,431 A | 12/1983 | Sasaki |
| 4,427,989 A | 1/1984 | Anantha et al. |
| 4,477,736 A | 10/1984 | Onishi |
| 4,493,056 A | 1/1985 | Mao |
| 4,567,542 A | 1/1986 | Shimada et al. |
| 4,577,214 A | 3/1986 | Schaper |
| 4,604,639 A | 8/1986 | Kinoshita |
| 4,605,980 A | 8/1986 | Hartranft et al. |
| 4,641,425 A | 2/1987 | Dubuisson et al. |
| 4,649,418 A | 3/1987 | Uden |
| 4,654,690 A | 3/1987 | Okada et al. |
| 4,656,605 A | 4/1987 | Clayton |
| 4,691,304 A | 9/1987 | Hori et al. |
| 4,720,737 A | 1/1988 | Shirato |
| 4,725,924 A | 2/1988 | Juan |
| 4,731,645 A | 3/1988 | Parmentier et al. |
| 4,737,830 A | 4/1988 | Patel et al. |
| 4,748,495 A | 5/1988 | Kucharek |
| 4,777,518 A | 10/1988 | Mihara et al. |
| 4,780,846 A | 10/1988 | Tanabe et al. |

(List continued on next page.)

FOREIGN PATENT DOCUMENTS

| JP | 56-15065 | 2/1981 |
| JP | 58-64048 | 4/1983 |
| JP | 58-77251 | 5/1983 |
| JP | 61-73367 | 4/1986 |

OTHER PUBLICATIONS

German Patent Application No. DE 28 10 054 A1 filed Mar. 8, 1978.
Japanese Patent Application No. Sho 61[1986]–73367 filed Sep. 19, 1984.
H.K. Charles, Jr., *Electrical Interconnection*, Electronic Materials Handbook™, vol. 1, Packaging, pp. 224–236 (Nov. 1989).

*Primary Examiner*—Fetsum Abraham
(74) *Attorney, Agent, or Firm*—TraskBritt

(57) ABSTRACT

Ball grid array packages that can be stacked to form highly dense components and the method for stacking ball grid arrays. The ball grid array packages comprise flexible or rigid substrates. The ball grid array packages additionally comprise an arrangement for the substantial matching of impedance for the circuits connected to the semiconductor devices.

23 Claims, 8 Drawing Sheets

U.S. PATENT DOCUMENTS

| | | |
|---|---|---|
| 4,835,416 A | 5/1989 | Miller |
| 4,931,853 A | 6/1990 | Masayuki et al. |
| 4,937,649 A | 6/1990 | Shiba et al. |
| 4,991,000 A | 2/1991 | Bone et al. |
| 4,992,849 A | 2/1991 | Corbett et al. |
| 4,992,850 A | 2/1991 | Corbett et al. |
| 4,996,587 A | 2/1991 | Hinrichsmeyer et al. |
| 5,012,323 A | 4/1991 | Farnworth |
| 5,016,138 A | 5/1991 | Woodman |
| 5,032,892 A | 7/1991 | Chern et al. |
| 5,045,921 A | 9/1991 | Lin et al. |
| 5,107,328 A | 4/1992 | Kinsman |
| 5,128,831 A | 7/1992 | Fox, III et al. |
| 5,137,836 A | 8/1992 | Lam |
| 5,182,632 A | 1/1993 | Bechtel et al. |
| 5,239,198 A | 8/1993 | Lin et al. |
| 5,255,156 A | 10/1993 | Chang |
| 5,266,821 A | 11/1993 | Chern et al. |
| 5,280,192 A | 1/1994 | Kryzaniwsky |
| 5,280,193 A | 1/1994 | Lin et al. |
| 5,307,309 A | 4/1994 | Protigal et al. |
| 5,322,207 A | 6/1994 | Fogal et al. |
| 5,323,060 A | 6/1994 | Fogal et al. |
| 5,367,435 A * | 11/1994 | Androse et al. ............ 361/792 |
| 5,399,898 A | 3/1995 | Chen |
| 5,422,435 A | 6/1995 | Takiar et al. |
| 5,434,745 A | 7/1995 | Shokrgozar et al. |
| 5,438,216 A | 8/1995 | Juskey et al. |
| 5,465,470 A | 11/1995 | Vongfuangfoo et al. |
| 5,477,067 A | 12/1995 | Isomura et al. |
| 5,477,082 A | 12/1995 | Buckley, III et al. |
| 5,480,840 A | 1/1996 | Barnes et al. |
| 5,483,024 A | 1/1996 | Russell et al. |
| 5,495,398 A | 2/1996 | Takiar et al. |
| 5,502,289 A | 3/1996 | Takiar et al. |
| 5,535,101 A | 7/1996 | Miles et al. |
| 6,013,948 A * | 1/2000 | Akram et al. ................ 257/698 |
| 6,054,753 A * | 4/2000 | Inaba ......................... 257/646 |

* cited by examiner

MODULE ASSEMBLY FOR STACKED BGA PACKAGES WITH A COMMON BUS BAR IN THE ASSEMBLY

CROSS REFERENCE TO RELATED APPLICATION

This application claims the benefit of U.S. Provisional Application No. 60/091,285 filed Jun. 30, 1998.

BACKGROUND OF THE INVENTION

1. Field of the Invention

The present invention relates to ball grid array packages that can be stacked to form highly dense components and the method for stacking ball grid arrays. The ball grid array packages may be stacked on flexible or rigid substrates.

2. State of the Art

Chip on board technology generally consists of three types of techniques for attaching a semiconductor device to a printed circuit board, such as flip chip attachment, wirebonding, and tape automated bonding techniques.

Flip chip attachment consists of attaching a semiconductor device, generally having a ball grid array (BGA), a slightly larger than integrated circuit carrier (SLICC), or a pin grid array (PGA) to a printed circuit board. With the BGA or SLICC, the solder ball arrangement on the semiconductor device must be a mirror-image of the connecting bond pads on the printed circuit board such that precise connections are made. The semiconductor device is bonded to the printed circuit board by refluxing the solder balls. With the PGA, the pin arrangement of the semiconductor device must be a mirror-image of the pin recesses on the printed circuit board. After insertion, the semiconductor device is generally bonded by soldering the pins into place. An underfill encapsulant is generally disposed between the semiconductor device and the printed circuit board to prevent contamination. A variation of the pin-in-recess PGA is a J-lead PGA, wherein the loops of the J's are soldered to pads on the surface of the circuit board. However, the lead and pad locations must coincide, as with the other types of flip-chip techniques.

Wirebonding and tape automated bonding (TAB) attachment generally begin with attaching a semiconductor device to the surface of a printed circuit board with an appropriate adhesive. In wirebonding, a plurality of bond wires is attached, one at a time, from each bond pad of the semiconductor device to a corresponding lead on the printed circuit board. The bond wires are generally attached through one of three industry-standard wirebonding techniques, such as ultrasonic bonding, using a combination of pressure and ultrasonic vibration bursts to form a metallurgical cold weld, thermocompression bonding, using a combination of pressure and elevated temperature to form a weld, and thermosonic bonding, using a combination of pressure, elevated temperature, and ultrasonic vibration bursts. The semiconductor device may be oriented having either the active surface up or the active surface down (with the bond pads thereon either up or down with respect to the printed circuit board) for wire bonding, although active surface up is the most common. With TAB, metal tape leads are attached between the bond pads on the semiconductor device and the leads on the printed circuit board. An encapsulant is generally used to cover the bond wires and metal tape leads to prevent contamination.

Although such methods are effective for bonding semiconductor devices to printed circuit boards, the terminal arrangements of the devices and the connection arrangements of the boards must be designed to accommodate one another. Thus, it may be impossible to electrically connect a particular semiconductor device to a printed circuit board for which the semiconductor device terminal arrangements were not designed to match the board's connection arrangement. With either wirebond or TAB attachment, the semiconductor device bond pad arrangement may not correspond to the lead ends on the circuit board, making attachment difficult due to the need for overlong wires and the potential for inter-wire contact and shorting. With flip chip attachment, if the printed circuit board connection arrangement is not a mirror-image of the solder ball or pin arrangement of the semiconductor device, electrically connecting the flip chip to the printed circuit board is impossible.

Ball grid array (BGA) semiconductor device packages are well known in the art. A BGA package typically comprises a substrate, such as a printed circuit board, with a semiconductor device, such as a dynamic random access memory device, mounted on the top side of the substrate. The semiconductor device has a plurality of bond pads on the active surface thereof electrically connected to a series of metal traces on the top surface or top side of the printed circuit board. The connection between the bond pads and the metal traces is provided by wire bonds electrically and mechanically connecting the semiconductor device and the printed circuit board. The series of metal traces on the printed circuit board is connected, in turn, to a second series of metal traces on the bottom surface or bottom side of the printed circuit board using a series of vias extending therethrough. The second series of metal traces each terminate with a connection contact pad where a conductive element is attached. The conductive elements can be solder balls or conductive filled epoxy. The conductive elements are arranged in an array pattern and the semiconductor device and wire bonds are encapsulated with a molding compound.

As semiconductor device and grid array densities increase, the desire in packaging semiconductor devices has been to reduce the overall height or profile of the semiconductor package. The use of BGA's has allowed for this reduction of profile as well as increased package density. Density has been increased by using lead frames, such as lead-over-chip type lead frames, in an effort to increase the semiconductor device density as well as allow stacking of the semiconductor devices one on top another.

One example of a lead chip design in a BGA package is shown in U.S. Pat. No. 5,668,405. A semiconductor device is disclosed having a lead frame attached to the semiconductor device. Through holes are provided that allow for solder bumps to connect via the lead frame to the semiconductor device. Such a mounting arrangement requires several steps for attaching the semiconductor device to the lead frame, then providing sealing resin, and subsequently adding a base film and forming through holes in the base film. A cover resin is added before solder bumps are added in the through holes to connect to the lead frame. This particular structure lacks the ability to stack semiconductor devices one on top another.

U.S. Pat. No. 5,677,566, commonly assigned to the assignee of the present invention, illustrates a semiconductor device package that includes discrete conductive leads with electrical contact bond pads on a semiconductor device. The lead assembly is encapsulated with a typical encapsulating material and electrode bumps are formed through the encapsulating material to contact the conductive leads. The electrode bumps protrude from the encapsulating material for connection to an external circuit. The semiconductor device has the bond pads located in the center of the active surface of the device, thus allowing the conductive leads to be more readily protected once encapsulated in the encapsulating material. However, the assembly illustrated in the '566 Patent lacks the ability to stack one semiconductor device on top another.

U.S. Pat. No. 5,625,221 illustrates a semiconductor device package assembly that has recessed edge portions that extend along at least one edge portion of the assembly in an attempt to form a stacked package of semiconductor devices. An upper surface lead is exposed therefrom and a top recess portion is disposed on a top surface of the assembly. A bottom recess portion is disposed on the bottom surface of the assembly such that when the assembly is used in fabricating a three-dimensional integrated circuit module, the recess edge portion accommodates leads belonging to an upper semiconductor assembly to provide electrical interconnection therebetween. However, the assembly requires long lead wires from the semiconductor chip to the outer edges. These lead wires add harmful inductance and unnecessary signal delay and can form a weak link in the electrical interconnection between the semiconductor device and the outer edges. Further, the assembly profile is a sum of the height of the semiconductor devices, the printed circuit boards to which they are bonded, the conductive elements, such as the solder balls, and the encapsulant that must cover the semiconductor devices and any wire bonds used to connect the devices to the printed circuit boards. Reducing such a package profile is difficult because of the geometries required in having the bond pads on the semiconductor device along the outer periphery with extended lead wires reaching from the semiconductor device to the outer edges.

U.S. Pat. Nos. 5,266,912 and 5,400,003 illustrate another stacked arrangement of semiconductor devices on a substrate interconnected by pins. However, the height of the stacked package is limited by the length of the pin connections between the individual multi-chip modules or printed circuit boards.

Another problem which arises in stacking semiconductor devices mounted on printed circuit boards is that it is difficult to provide a flat, smooth surface on which to mount the printed circuit board. Accordingly, flexible boards have been developed to allow both lighter-weight structures and greater adaptability at conforming to nonuniform surfaces. However, the use of such flexible circuit boards has resulted in other problems, such as the problem in joining several flexible boards while maintaining the proper interconnection between the respective boards. Further, in some applications, such as protecting semiconductor devices mounted on a bottom surface of a flexible substrate from touching the top of another flexible circuit boards, the use of a rigid member or assembly is required to support the stacked flexible circuit boards. This sacrifices the flexibility that is present in the flexible circuit boards that allows their compliance with a non-planar surface.

U.S. Pat. No. 5,440,171 illustrates semiconductor devices mounted on flexible, stackable circuit boards to form semiconductor modules. A basic structure unit is illustrated comprising a flexible circuit board made from a polyamide film with circuit lines formed on both sides, typically using copper foil. A supporting frame is provided and bonded to the flexible circuit board with a heat-resistant resin, such as a polyamide resin. Electrical connections are possible between the flexible circuit board and the support frame. Conductive through holes are provided so that electrical continuity exists between a semiconductor device mounted upon the flexible circuit board and either at least one other semiconductor device mounted on another flexible circuit board stacked within the module assembly or an outside source upon which the entire basic structure unit is mounted. The semiconductor devices are electrically connected to electrodes on the support frame. Although the semiconductor device is mounted on a flexible circuit board that is stackable in an arrangement, the support frame attaching the stackable circuit boards one to another is made from a rigid material that does not allow for any bending. One type of frame material is ceramic, such as silicon nitride. Silicon nitride is used for its high thermal conductivity for heat radiation or dissipation when the semiconductor device has a high power consumption. Since the support frame is made from rigid and non-flexible material, the semiconductor device package assembly needs to be mounted on a substantially planar surface, thereby preventing the assembly from being molded on surfaces that are not uniformly planar or smooth.

Additionally, when stacking semiconductor devices using flexible or rigid substrates, as the operation speed of the semiconductor device increases it is desirable to match the impedance of the various circuits to which the semiconductor devices are connected, to try to keep the circuit response time the same for each circuit. Since in stacked arrangements the circuit length for each semiconductor device will vary, attention must be given to keeping the circuit impedance substantially the same.

Accordingly, what is needed is a ball grid array package that allows for the stacking of packages where printed circuit board substrates or flexible substrates may be used as desired and which allows for the matching of the impedance for the different circuits as required.

SUMMARY OF THE INVENTION

The present invention comprises ball grid array packages that can be stacked to form highly dense components and the method for stacking ball grid arrays. The ball grid array packages comprise flexible or rigid substrates. Additionally, the present invention comprises an arrangement for the substantial matching of impedance for the circuits connected to the semiconductor devices.

DESCRIPTION OF THE INVENTION

Figure 1:
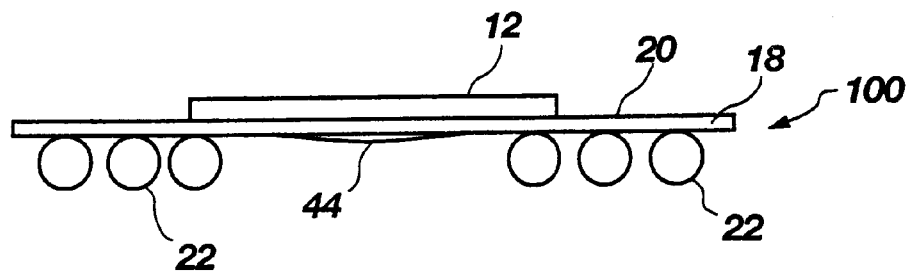
FIG. 1 is a view of a semiconductor package for use in the present invention.

Referring to drawing FIG. 1, a wire bond style/flip chip assembly 100 is illustrated. An adapter board 18 is shown having a semiconductor device 12 located on the upper surface 20 thereof with the lower surface of the adapter board 18 having a plurality of solder balls 22 located thereon in rows for connection purposes.

Figure 2:
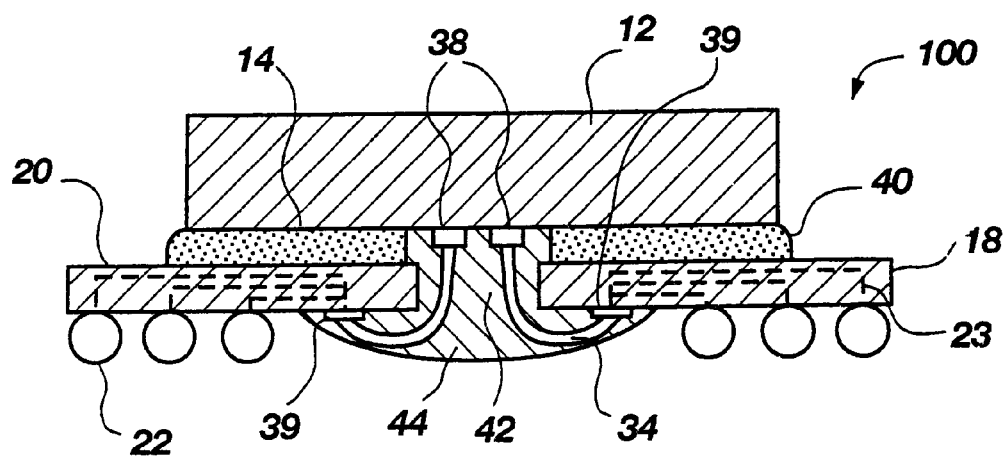
FIG. 2 is a cross sectional view of a semiconductor package for use in the present invention.

Referring to drawing FIG. 2, the wire bond style/flip chip assembly 100 is illustrated in cross section. The semiconductor device 12 has a plurality of bond pads 38 arranged in two rows on the active surface 14 thereof. The semiconductor device 12 is secured to the adapter board 18 by a suitable adhesive 40. The adapter board 18 is formed having at least one longitudinally extending aperture 42 therethrough and a plurality of connection pads 39 located on the bottom surface thereof. A plurality of circuits or circuit traces 23 of adapter board 18 connect S connection pads 39 to a desired solder ball(s) 22. Wires 34 extend between the bond pads 38 of the semiconductor device 12 and the connection pads 39 of the adapter, board 18, the wires being bonded to the pads 38 and 39 through the use of a suitable wire bonder well known in the industry. After the connections using wires 34 have been made through aperture 42 in adapter board 18, a suitable encapsulant material 44 is applied to the aperture 42 to cover the wires 34, the bond pads 38 on the semiconductor device 12, and the connection pads 39 on the adapter board 18.

Figure 3:
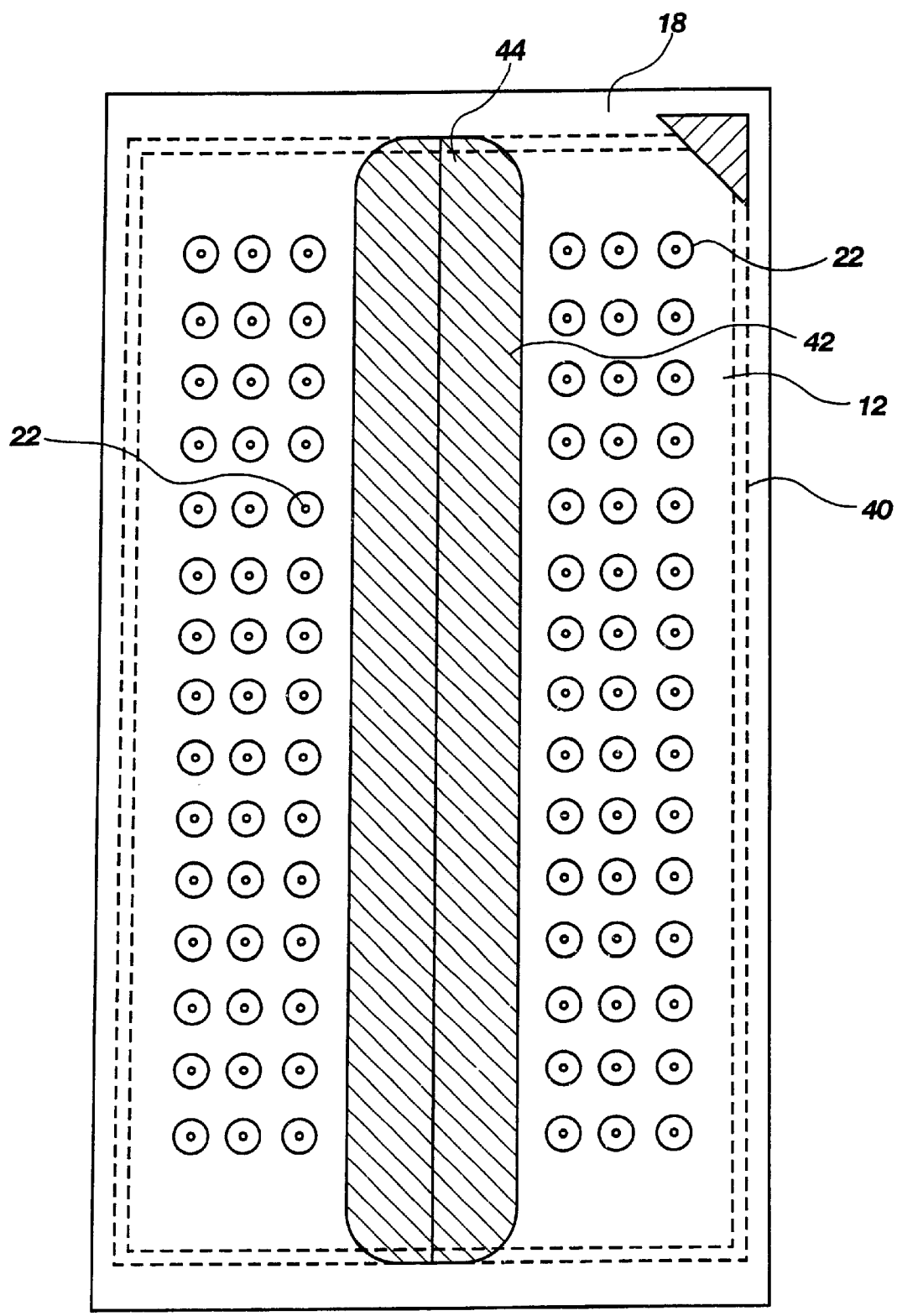
FIG. 3 is a bottom view of a semiconductor package for use in the present invention.

Referring to drawing FIG. 3, a adapter board 18 is illustrated from the bottom thereof. As illustrated, the encapsulant material 44 covers the aperture 42 in the adapter board 18. The solder balls 22 are illustrated in a plurality of rows. The semiconductor device 12 is shown in dashed lines as well as adhesive 40 connecting the semiconductor device 12 to the upper surface of the adapter board 18.

Figure 4:
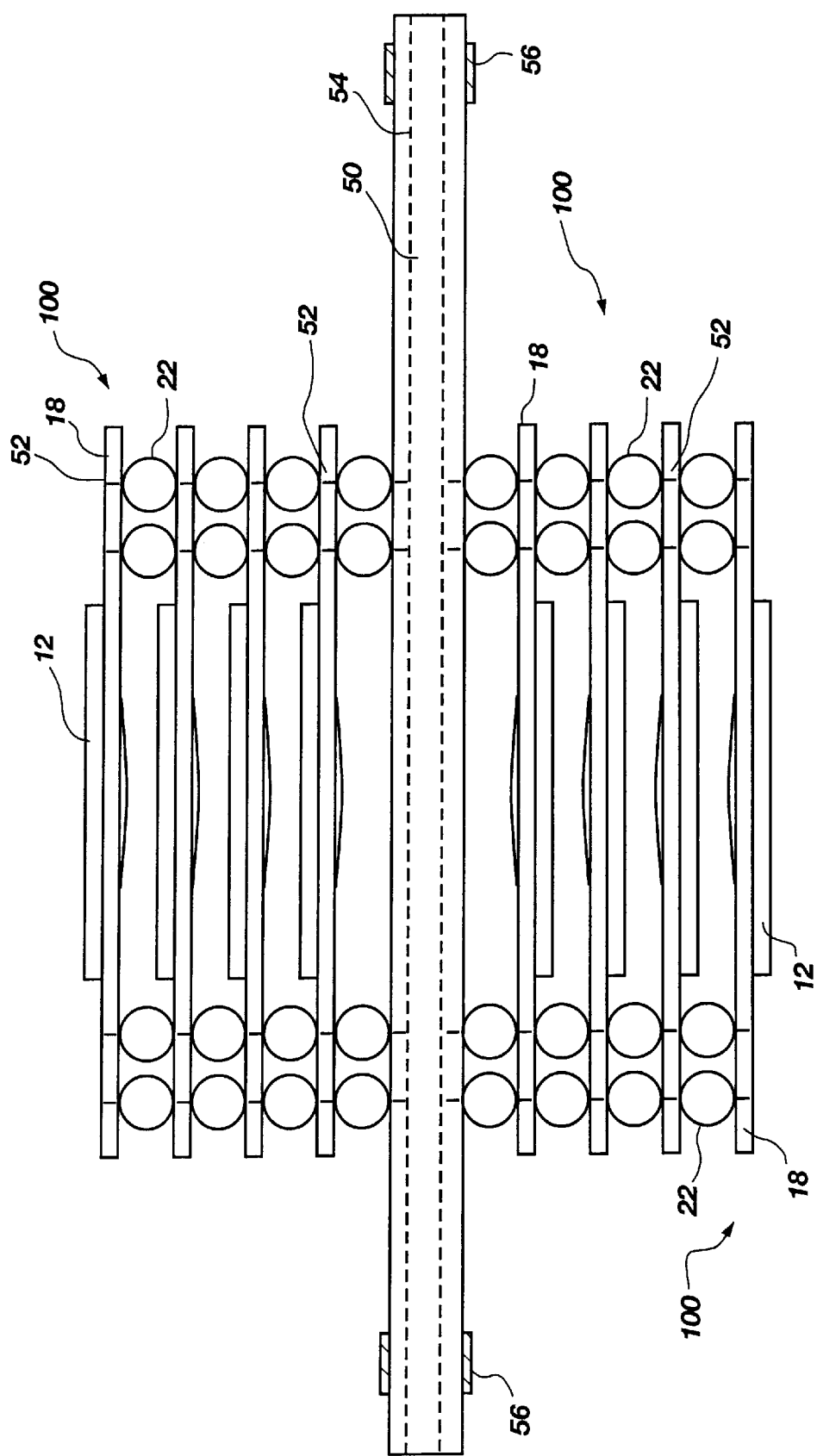
FIG. 4 is a side view of a first embodiment of the present invention using semiconductor packages in a stacked package arrangement on each side of a substrate.

Referring to drawing FIG. 4, a plurality of wire bond style/flip chip assemblies 100 is illustrated connected to a substrate 50 in a stacked arrangement, each assembly 100 having two rows of solder balls 22 thereon. Each assembly 100 is connected to another assembly 100 through circuits 52 in boards 18 and connected to circuits 54 in substrate 50. The substrate 50 may be any suitable substrate, such as a printed circuit board, FR-4 board or the like, which is structurally and electrically capable of connecting a plurality of assemblies 100 thereto. Any desired number of assemblies 100 may be connected to the substrate 50 on both or only one side thereof. The substrate 50 may have connection pads 56 thereon connected to circuits 54 for connection to other circuits or components. Although one stack of assemblies 100 has been illustrated on each side of the substrate 50, any number may be used on each side or one side of the substrate 50.

Figure 5:
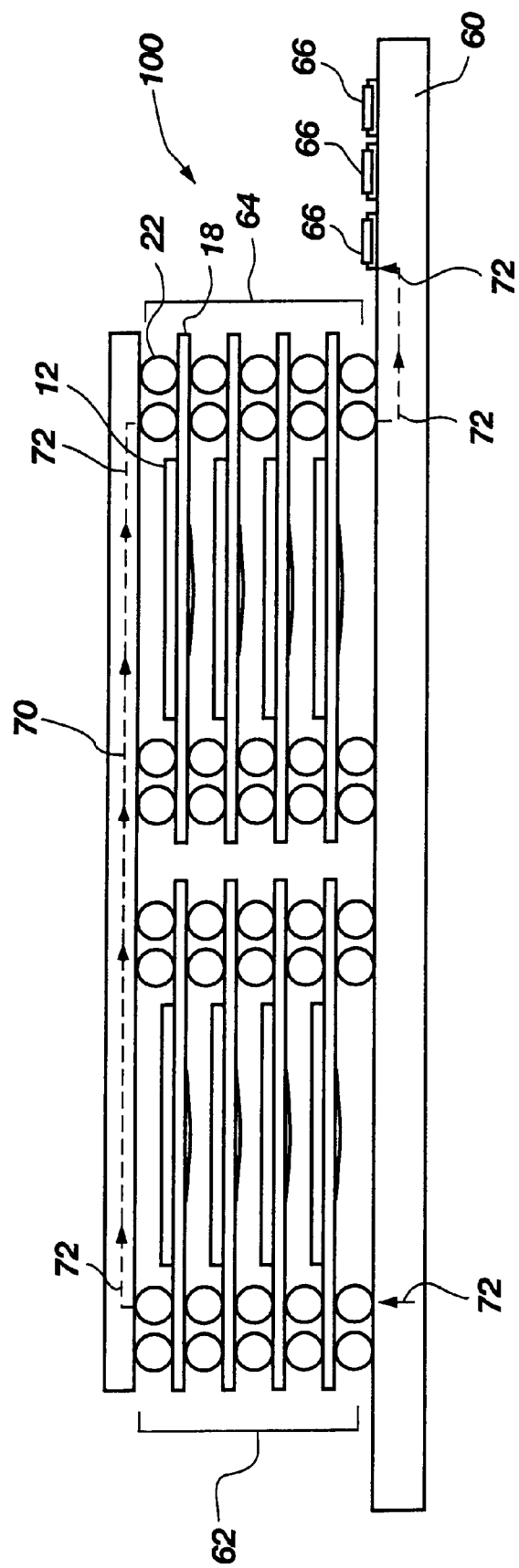
FIG. 5 is a side view of a second embodiment of the present invention using semiconductor packages stacked in a package arrangement on one side of a substrate wherein resistors and a bus bar arrangement are used to match the impedance of the circuits.

Referring to drawing FIG. 5, a plurality of wire bond style/flip chip assemblies 100 is illustrated installed on a substrate 60 having suitable circuits therein in a first stack 62 and a second stack 64, the assemblies 100 being interconnected using solder balls 22. The substrate 60 may be any suitable substrate, such as a printed circuit board, FR-4 board, or the like, capable of supporting the stacks 62 and 64 of assemblies 100. In the arrangement, the stacked assemblies 100 are serially connected by means of the solder balls 22 using a jumper board 70 which includes bus lines therein and acts as a heat sink for the stacks 62 and 64. The jumper board 70 may be any suitable board, such as a printed circuit board, FR-4 board, or the like. Included on the substrate 60 is a plurality of resistors 66 which is used to balance the impedance of the circuits of the serially connected assemblies 100 in the stacks 62 and 64. The assemblies 100 are serially connected to a resistor 66 through the circuits in the substrate 60 and jumper board 70 as illustrated by the arrows 72. In this manner, the impedance of the various circuits in the assemblies 100 in the stacks 62 and 64 may be matched so that the response of the stacked assemblies 100 will not substantially vary.

Figure 6:
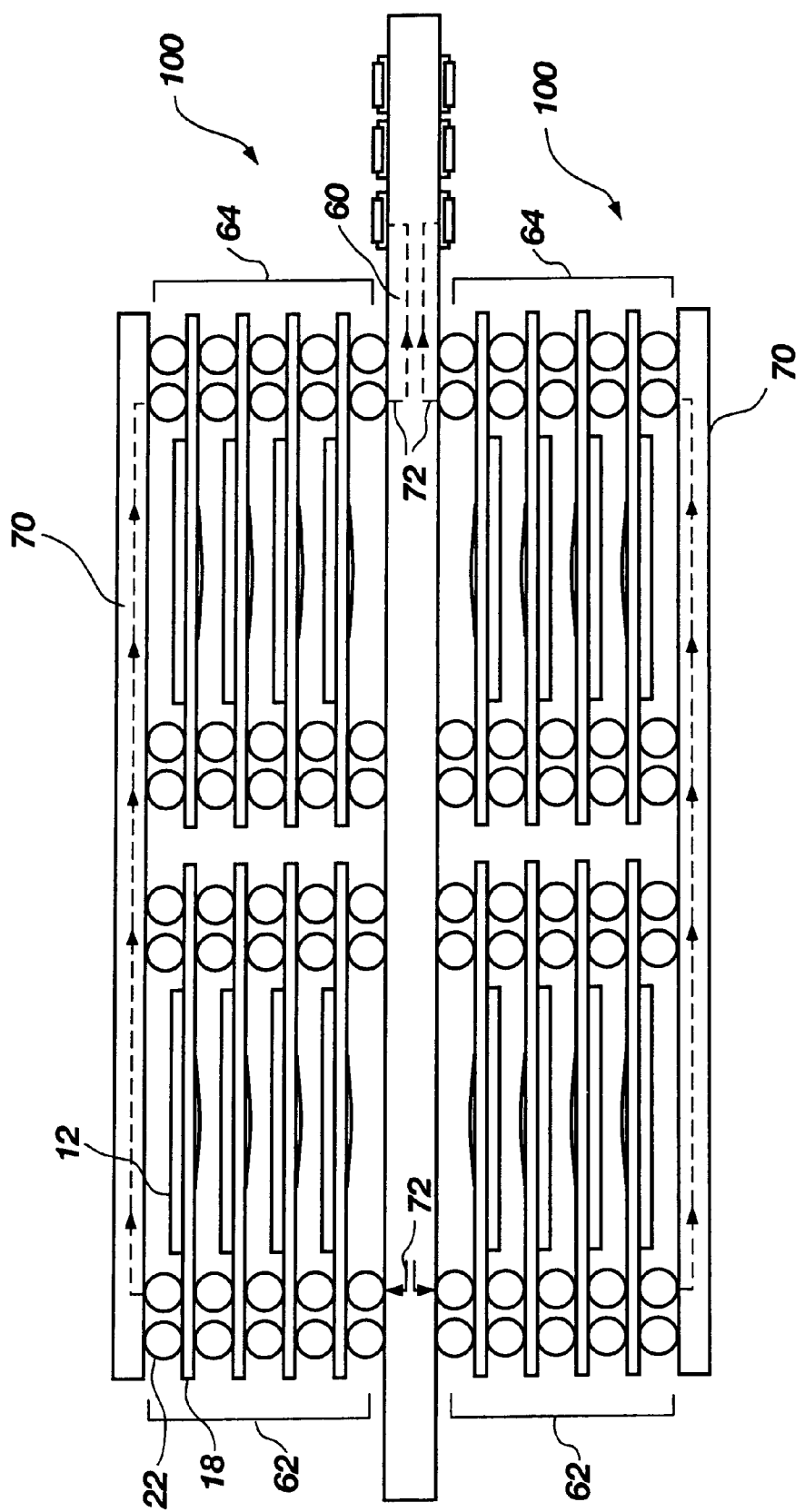
FIG. 6 is a side view of a third embodiment of the present invention using semiconductor packages stacked in a package arrangement on both sides of a substrate wherein resistors and bus bars are used to match the circuit impedance of the stacked packages.

Referring to drawing FIG. 6, a plurality of wire bond style/flip chip assemblies 100 is illustrated installed on both sides of a substrate 60 having suitable circuits therein in first stacks 62 and second stacks 64, the assemblies 100 being interconnected using solder balls 22. The substrate 60 may be any suitable substrate, such as a printed circuit board, FR-4 board, or the like, capable of supporting the stacks 62 and 64 of assemblies 100. In the arrangement, the stacked assemblies 100 are serially connected by means of the solder balls 22 using jumper boards 70 which include bus lines therein and act as heat sinks for the stacks 62 and 64. The jumper boards 70 may be any suitable board, such as a printed circuit board, FR-4 board, or the like. Included on the substrate 60 is a plurality of resistors 66 which is used to balance the impedance of the circuits of the serially connected assemblies 100 in the stacks 62 and 64. The assemblies 100 are serially connected to a resistor 66 through the circuits in the substrate 60 and jumper board 70 as illustrated by the arrows 72. In this manner, the impedance of the various circuits in the assemblies 100 in the stacks 62 and 64 may be matched so that the response of the stacked assemblies 100 will not substantially vary.

Figure 7:
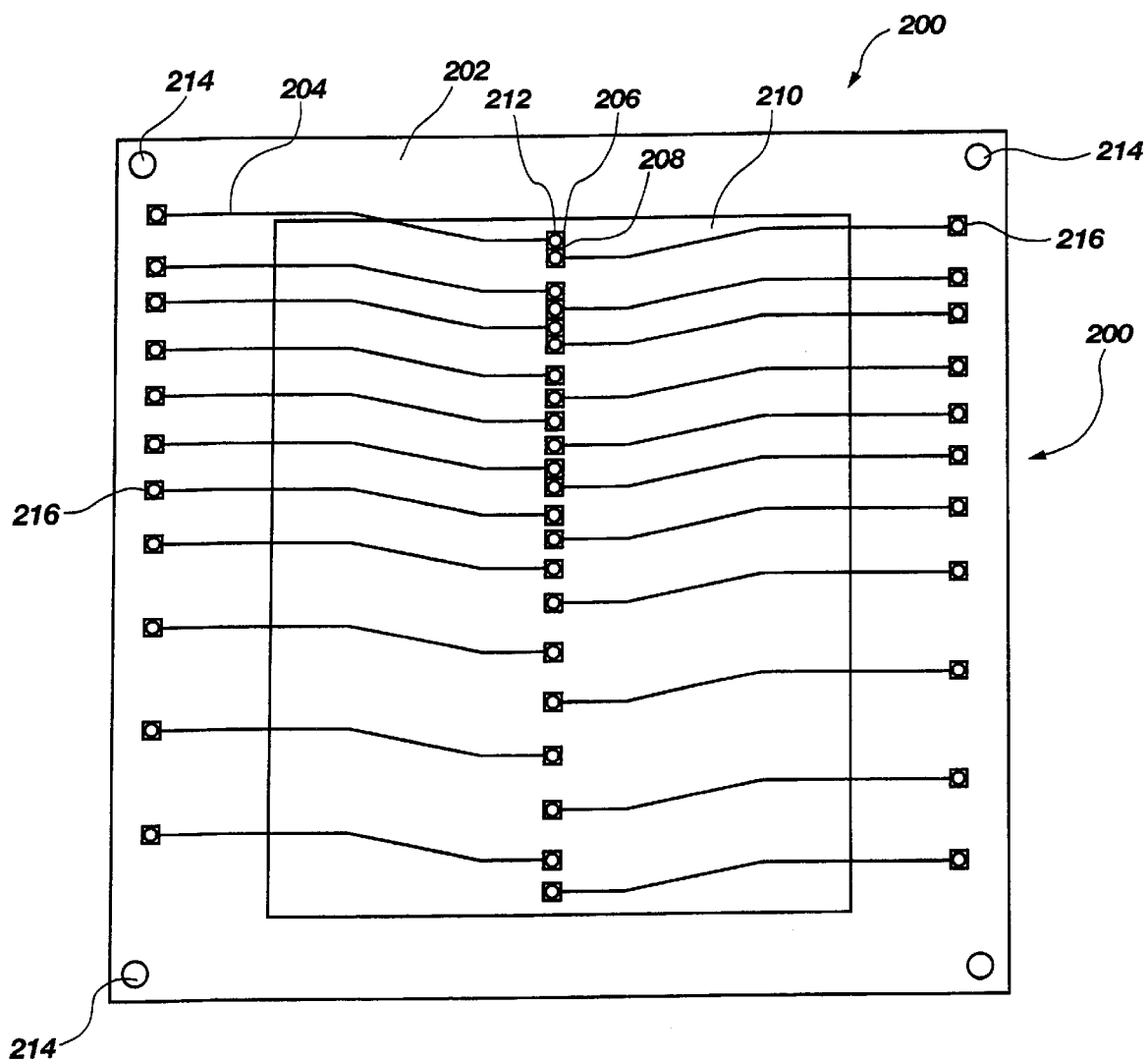
FIG. 7 is a top view of a fourth embodiment of the semiconductor package of the present invention using a flexible substrate for the mounting of a semiconductor device thereon.

Referring to drawing FIG. 7, a bottom view of an assembly 200 of a flexible substrate 202 is illustrated having a plurality of conductors 204 formed thereon connected by bonds 206 through apertures 212 in substrate 202 to bond pads 208 of semiconductor device 210. The flexible substrate 202 may be any suitable type material, such as polyamide tape, and have a plurality of desired conductors 204 formed thereon, such as copper type conductors. The substrate 202 may include alignment apertures 214 therein, if desired. The substrate 202 further includes apertures 216 therein for the connection of the conductors 204 to other conductors 204 on adjacent stacked substrates. The apertures 216 have a size sufficient to allow a solder ball having a diameter of at least twice the thickness of the substrate 202 to be used therein. A gold ball type bond 206 may be used to connect the conductors 204 to the bond pads 208 of the semiconductor device 210.

Figure 8A:
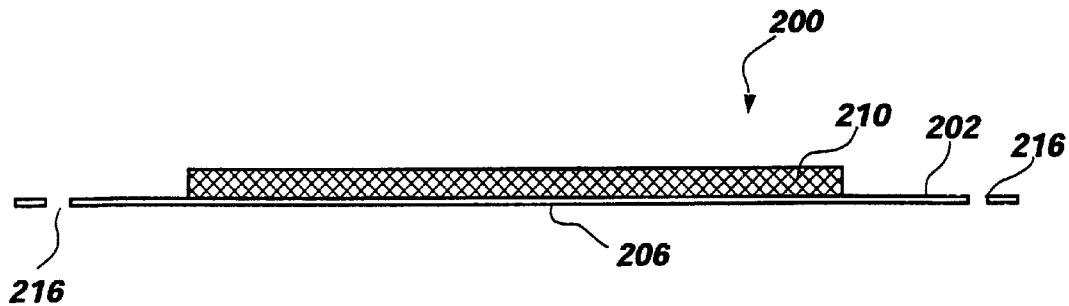
FIG. 8A is a side view of the fourth embodiment of the semiconductor package of the present invention of FIG. 7 shown in cross section using a flexible substrate for the mounting of a semiconductor device thereon.

Referring to drawing FIG. 8A, the assembly 200 is shown in cross section, the flexible substrate 202 having the semiconductor device 210 mounted on the upper surface thereof with bonds 206 to the bond pads 208 of the semiconductor device 210 and conductors 204 of the substrate 202.

Figure 8B:
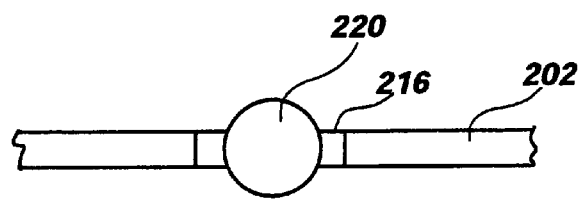
FIG. 8B is an enlarged view of a portion of the flexible substrate of the semiconductor package of FIG. 8A.

Referring to drawing FIG. 8B, a portion of the flexible substrate 202 is illustrated having aperture 216 therein having a solder ball 220 contained therein for connection to an adjacent substrate 202.

Figure 9:
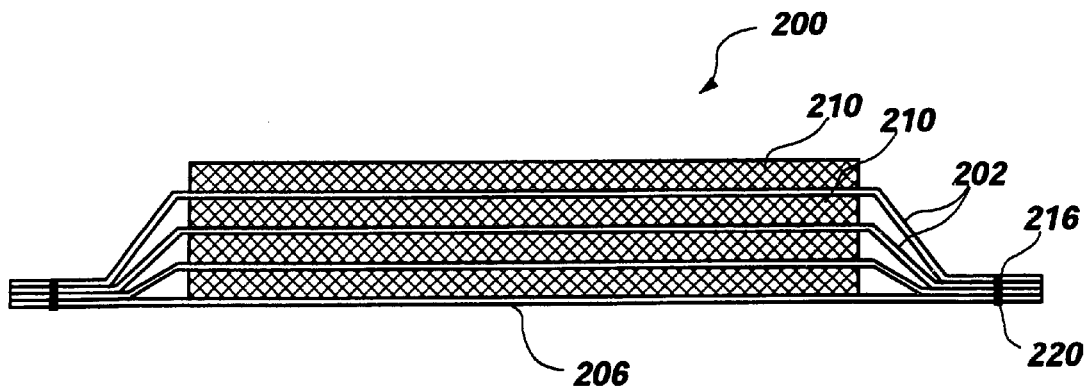
FIG. 9 is a side view of a fifth embodiment of the semiconductor package of the present invention using a plurality of stacked semiconductor packages using a flexible substrate for the mounting of a semiconductor device thereon.

Referring to drawing FIG. 9, a plurality of stacked assemblies 200 is illustrated being vertically stacked with the flexible substrates 202 extending therebetween and connections between the conductors 204 (not shown) of each flexible substrate 202 being made through apertures 216 in the substrates 202 by means of melted solder balls 220 extending therebetween in the apertures 216. Since polyamide tape is used as the substrate 202, the substrate is flexible and readily bends and complies to the vertically stacked arrangement of a plurality of assemblies 200. As illustrated, a stacked arrangement of assemblies 200 is made on one side of the bottom substrate 202. The assemblies 200 are aligned through the use of the alignment apertures 214 (not shown) in the flexible substrates 202 forming the stacked arrangement. If desired, a mechanical connection may be made to the melted solder balls 220 in the apertures 216 to connect the conductors 204 to the appropriate bond pad of the semiconductor device 210.

Each assembly 200 may be fabricated individually or in strip form and subsequently singulated.

Figure 10:
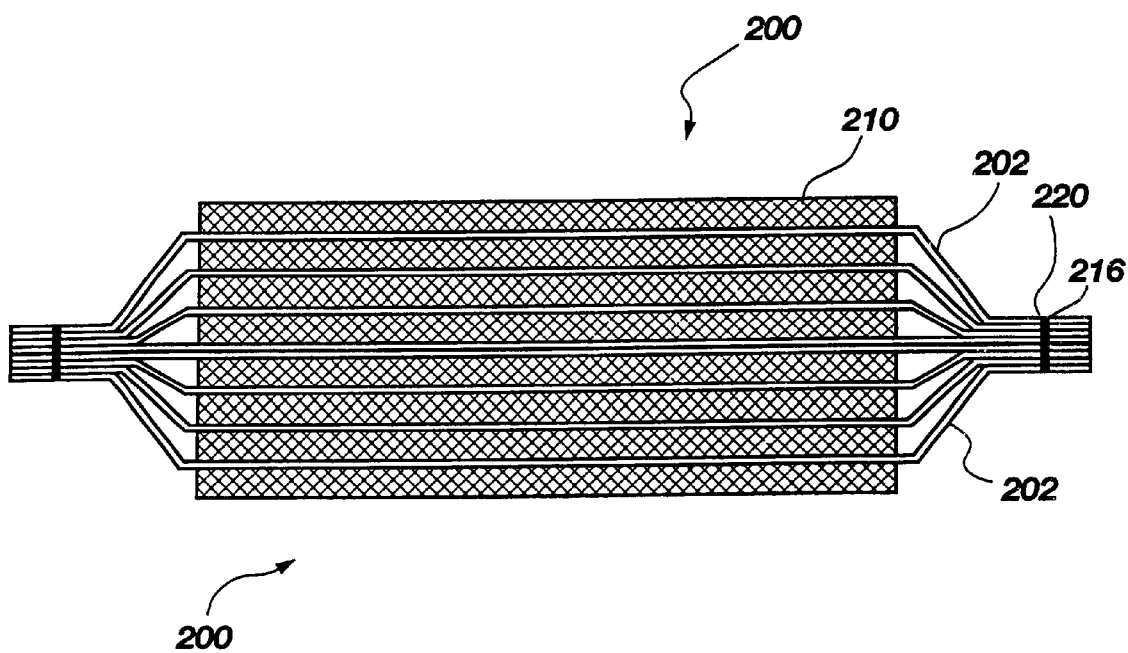
FIG. 10 is a side view of a sixth embodiment of the semiconductor package of the present invention using a plurality of stacked semiconductor packages using a flexible substrate for the mounting of a semiconductor device thereon.

Referring to drawing FIG. 10, a vertically stack of assemblies 200 is illustrated where the assemblies 200 are stacked on both sides of the bottom substrate 202 with interconnections between the conductors 204 on the substrates 202 being made by melted solder balls 220 extending within apertures 216 of the substrates 202. The assemblies 200 are aligned through the use of the alignment apertures 214 (not shown) in the flexible substrates 202 forming the stacked arrangement. If desired, a mechanical connection may be made to the melted solder balls 220 in the apertures 216 to connect the conductors 204 to the appropriate bond pad of the semiconductor device 210.

Having thus described the invention, it will be understood that changes, revisions, additions, and deletions may be made to the invention which will come within the scope of the invention. Such may be required by the design of the semiconductor device and its attachment to the substrates and/or to adjacent assemblies of semiconductor devices.

What is claimed is:

1. An assembly having a semiconductor device and a substrate, said assembly comprising:
   a plurality of first substrates, each first substrate of the plurality of first substrates having a first side, a second side, an aperture therethrough, at least a portion of at least one circuit located on the first side and on the second side thereof, and a plurality of connection areas on the first side thereof;
   a plurality of semiconductor devices, each semiconductor device of the plurality of semiconductor devices having an active surface and a plurality of bond pads thereon, at least a portion of the active surface of a semiconductor device secured to the first side of a first substrate of the plurality of first substrates, at least one wire extending through the aperture in the first substrate and connected to a portion of the at least one circuit on the second side of the first substrate and at least one bond pad of the plurality on the active surface of the semiconductor device of the plurality of semiconductor devices; a second substrate having a first side, a second side, and having portions of at least two circuits on the first side, a portion of one of the at least two circuits connected to the at least one circuit on the second side of at least one first substrate of the plurality of first substrates;
   at least one connection between the at least one circuit on a first substrate of the plurality of first substrates and one of the at least two circuits of the second substrate;
   a bus bar having a first side, a second side, and at least one circuit thereon; and
   a connection between one of the plurality of connection areas on the first side of the first substrate of the plurality of first substrates and the at least one circuit on the bus bar.

2. The assembly of claim 1, wherein the second substrate includes at least a portion of one circuit on the first side and at least a portion of one circuit on the second side thereof.

3. The assembly of claim 2, wherein at least one first substrate of the plurality is connected to the at least one circuit on the first side and the at least one circuit on the second side of the second substrate.

4. The assembly of claim 1, wherein the plurality of first substrates is assembled in a first stack and a second stack on the first side of the second substrate.

5. The assembly of claim 4, further comprising:
   at least one connection between the at least one circuit on a first substrate in the first stack of first substrates and one of the at least two circuits of the second substrate;
   at least one connection between the at least one circuit on a first substrate in the second stack of first substrates and another circuit of the at least two circuits of the second substrate;
   a bus bar having a first side, a second side, and at least one circuit thereon; and
   a connection between one of the plurality of connection areas on the first side of the first substrate of the first stack of the first substrates and the at least one circuit of the bus bar and a connection between one of the plurality of connection areas on the first side of a first substrate of the second stack of the first substrates and the at least one circuit of the bus bar.

6. The assembly of claim 5, further comprising:
   an electrical component connected to one of the at least two circuits on the second substrate.

7. The assembly of claim 6, wherein the electrical component includes a resistor.

8. The assembly of claim 7, wherein the resistor substantially affects the impedance of the one of the at least two circuits on the second substrate.

9. The assembly of claim 8, wherein the first stack of first substrates and the second stack of first substrates are included on each side of the second substrate.

10. An assembly having a semiconductor device and a substrate, said assembly comprising:
    a plurality of first substrates, each first substrate of the plurality of substrates having a first side, a second side, an aperture therethrough, at least a portion of at least one circuit located on the first side and on the second side thereof, and a plurality of connection areas on the first side thereof;
    a plurality of semiconductor devices, each semiconductor device of the plurality of semiconductor devices having an active surface and a plurality of bond pads thereon, at least a portion of the active surface of the semiconductor device secured to the first side of a substrate of the plurality of first substrates, at least one wire extending through the aperture in the first substrate and connected to the at least one circuit on the second side of the first substrate and at least one bond pad of the plurality on the active surface of the semiconductor device of the plurality of bond pads;

a second substrate having a first side, a second side, and a plurality of circuits on the first side, one of the plurality of circuits on the first side connected to the at least one circuit on the second side of the plurality of first substrates;

at least two connections between circuits on at least two first substrates in a first stack of first substrates and at least two circuits of the plurality of circuits on the first side of the second substrate;

at least two connections between circuits on at least two first substrates in a second stack of first substrates and at least two other circuits of the plurality of circuits on the first side of the second substrate;

a bus bar having a first side, a second side, and at least two circuits thereon;

a first connection between one of the plurality of connection areas on the first side of a first substrate of the first stack of first substrates and a first circuit of the at least two circuits of the bus bar and a connection between one of the plurality of connection areas on the first side of a first substrate of the second stack of first substrates and the first circuit of the at least two circuits on the bus bar; and a second connection between one of the plurality of connection areas on the first side of a first substrate of the first stack of first substrates and a second circuit of the at least two circuits of the bus bar and a connection between one of the plurality of connection areas on the first side of a first substrate of the second stack of first substrates and the second circuit of the at least two circuits of the bus bar.

11. The assembly of claim 10, further comprising:
at least two electrical components, at least one electrical component connected to one of the plurality of circuits on the first side of the second substrate.

12. The assembly of claim 11, wherein the at least one electrical component of the at least two electrical components includes a resistor.

13. The assembly of claim 12, wherein the resistor substantially affects the impedance of a circuit in which the resistor is connected.

14. A semiconductor device assembly having a semiconductor device and a substrate, said assembly comprising:
a plurality of first substrates, each first substrate of the plurality of first substrates having a first side, a second side, an aperture therethrough, at least one circuit having a portion located on the first side and on the second side thereof, and a plurality of connection areas on the first side thereof;

a plurality of semiconductor devices, each semiconductor device of the plurality having an active surface and a plurality of bond pads thereon, at least a portion of the active surface of the semiconductor device secured to the first side of a first substrate of the plurality of first substrates, at least one wire extending through the aperture in first substrate of the plurality and connected to the at least one circuit on the second side of the first substrate and at least one bond pad of plurality on the active surface of the semiconductor device;

a second substrate having a first side, a second side, and at least two circuits on the first side, one of the at least two circuits connected to the at least one circuit on the second side of the first substrate of the plurality of first substrates;

at least one connection between the at least one circuit on the first substrate of the plurality and the at least one circuit of the second substrate;

a bus bar having a first side, a second side, and at least one circuit thereon; and a connection between one of the plurality of connection areas on the first side of a first substrate of the plurality of first substrates and the at least one circuit on the bus bar.

15. The semiconductor device assembly of claim 14, wherein the second substrate includes at least one circuit on at least one of the first side and the second side thereof.

16. The semiconductor device assembly of claim 15, wherein at least one first substrate of the plurality is connected to the at least one circuit on at least one of the first side and the second side of the second substrate.

17. The semiconductor device assembly of claim 14, wherein the plurality of first substrates is assembled in a first stack and a second stack on the first side of the second substrate.

18. The semiconductor device assembly of claim 17, further comprising:
at least one connection between the at least one circuit on at least one first substrate in the first stack of first substrates and at least one of the at least two circuits of the second substrate;

at least one connection between the at least one circuit on at least one first substrate in the second stack of first substrates and at least one other circuit of the at least two circuits of the second substrate;

a bus bar having a first side, a second side, and at least one circuit thereon; and a connection between one of the plurality of connection areas on the first side of a first substrate of the first stack of first substrates and the at least one circuit of the bus bar and a connection between one of the plurality of connection areas on the first side of a first substrate of the second stack of first substrates and the at least one circuit of the bus bar.

19. The semiconductor device assembly of claim 18, further comprising:
an electrical component connected to one of the at least two circuits on the second substrate.

20. The semiconductor device assembly of claim 19, wherein the electrical component includes a resistor.

21. The semiconductor device assembly of claim 20, wherein the resistor substantially affects the impedance of the one of the at least two circuits on the second substrate.

22. The semiconductor device assembly of claim 21, wherein a first stack of first substrates and a second stack of first substrates are included on each side of the second substrate.

23. A semiconductor device assembly having a semiconductor device and a substrate, said assembly comprising:
a plurality of first substrates, each first substrate of the plurality of first substrates having a first side, a second side, an aperture therethrough, at least one circuit having a portion located on the first side and on the second side thereof, and a plurality of connection areas on the first side thereof;

a plurality of semiconductor devices, each semiconductor device of the plurality having an active surface and a plurality of bond pads thereon, the active surface of each semiconductor device secured to the first side of a first substrate of the plurality of first substrates, at least one wire extending through the aperture in the first substrate and connected to the at least one circuit on the second side of the first substrate and at least one bond pad of the plurality on the active surface of the semiconductor device;

a second substrate having a first side, a second side and, a plurality of circuits on the first side, one of the plurality of circuits on the first side connected to the at least one circuit on the second side of each of the plurality of first substrates;

at least two connections between at least two circuits on a plurality of first substrates in a first stack of first substrates and at least two circuits of the plurality of circuits on the second substrate;

at least two connections between at least two circuits on a plurality of first substrates in a second stack of first substrates and at least two other circuits of the plurality of circuits on the second substrate;

a bus bar having a first side, a second side, and at least two circuits thereon;

a first connection between one of the plurality of connection areas on the first side of a first substrate of the first stack of first substrates and one of the at least two circuits of the bus bar and a connection between one of the plurality of connection areas on the first side of a first substrate of the second stack of first substrates and the at least one circuit of the bus bar; and a second connection between one of the plurality of connection areas on the first side of a first substrate of the first stack of first substrates and one of the at least two circuits of the bus bar and a connection between one of the plurality of connection areas on the first side of a first substrate of the second stack of first substrates and another circuit of the at least two circuits of the bus bar.

\* \* \* \* \*

UNITED STATES PATENT AND TRADEMARK OFFICE
CERTIFICATE OF CORRECTION

PATENT NO.   : 6,414,391 B1
DATED        : July 2, 2002
INVENTOR(S)  : David J. Corisis et al.

It is certified that error appears in the above-identified patent and that said Letters Patent is hereby corrected as shown below:

Column 1,
Line 19, change "Chip on board" to -- Chip-on-board --

Column 3,
Line 51, change "boards" to -- board --

Column 5,
Line 33, change "connect S" to -- connects --
Line 36, delete the comma after "adapter"

Column 7,
Line 23, change "vertically" to -- vertical --

Column 8,
Line 66, after "device" delete "of the plurality of bond pads"

Column 9,
Line 56, after "in" and before "first" insert -- a --
Line 58, after "of" and before "plurality" insert -- the --

Column 11,
Line 21, before "plurality" change "a" to -- the --

Signed and Sealed this

Fifteenth Day of July, 2003

JAMES E. ROGAN
*Director of the United States Patent and Trademark Office*